United States Patent
Hamada

[19]

[11] Patent Number: 6,060,899
[45] Date of Patent: May 9, 2000

[54] SEMICONDUCTOR DEVICE WITH TEST CIRCUIT

[75] Inventor: Etsuo Hamada, Kumamoto, Japan

[73] Assignee: NEC Corporation, Tokyo, Japan

[21] Appl. No.: 09/044,100

[22] Filed: Mar. 19, 1998

[30] Foreign Application Priority Data

May 27, 1997 [JP] Japan ................................. 9-136827

[51] Int. Cl.⁷ .................................................. G01R 31/02
[52] U.S. Cl. ........................... 324/765; 365/201; 324/550
[58] Field of Search ...................................... 324/765, 550;
365/201, 96, 200, 226

[56] References Cited

U.S. PATENT DOCUMENTS

| | | | |
|---|---|---|---|
| 4,158,147 | 6/1979 | Edwards ..................................... | 365/96 |
| 4,837,520 | 6/1989 | Golke et al. .............................. | 324/550 |
| 5,557,573 | 9/1996 | McClure . | |
| 5,726,945 | 3/1998 | Ukita et al. ............................... | 365/226 |
| 5,905,683 | 5/1999 | McClure .................................. | 365/201 |

FOREIGN PATENT DOCUMENTS

| | | |
|---|---|---|
| 0 283 186 | 9/1988 | European Pat. Off. . |
| 0 670 548 | 9/1995 | European Pat. Off. . |
| 60-127477 | 7/1985 | Japan . |
| 63-276268 | 11/1988 | Japan . |
| 6-51032 | 2/1994 | Japan . |
| 7-263563 | 10/1995 | Japan . |

*Primary Examiner*—Josie Ballato
*Assistant Examiner*—Minh Tang
*Attorney, Agent, or Firm*—Young & Thompson

[57] ABSTRACT

In a semiconductor circuit device, a wiring line is connected to an internal circuit and to a test circuit which is connected to a power supply voltage line and a ground voltage line. The test circuit includes a first fuse resistor connected to the power supply voltage line, a first resistor connected between the first fuse resistor and the ground voltage line, a second resistor connected to the power supply voltage line, a second fuse resistor connected between the second resistor and the ground voltage line, a p-type transistor and an n-type transistor. The p-type transistor has a first drain connected to the wiring line, a first source connected to the power supply voltage line, and a gate connected to a connection point between the first fuse resistor and the first resistor. Also, the n-type transistor has a second drain connected to the wiring line, a second source connected to the ground voltage line, and a second gate connected to a connection point between the second resistance and the second fuse resistor.

17 Claims, 3 Drawing Sheets

SEMICONDUCTOR DEVICE WITH TEST CIRCUIT

BACKGROUND OF THE INVENTION

1. Field of the Invention

The present invention relates to a semiconductor device containing a test circuit which is used to analyze any fault in a wafer state.

2. Description of the Related Art

In the structure of a conventional semiconductor device, external terminals are electrically independent. A voltage which is given to a pair of pads of the external terminals is applied to the internal circuit. FIG. 1 is a circuit diagram which shows a conventional example of a semiconductor circuit. The potential which is given to an external terminal 1 is applied only to an internal circuit 2 which is connected to the external terminal 1. The external terminal 1 is electrically independent from other external terminals.

FIG. 2 is a circuit diagram of a semiconductor device which contains a test circuit which is described in Japanese Laid Open Patent Disclosure (JP-A-Heisei 6-51032). In this circuit, when the test circuit 8 becomes unnecessary, a fuse 4 is cut out so that an input potential is set to a potential which is determined by a depletion type transistor 7. Therefore, the above-mentioned test circuit 8 can be made impossible to operate without applying a potential to an NG terminal 3.

In the above-mentioned conventional example of the semiconductor circuit device shown in FIG. 1, it is sometimes impossible to apply potentials to all external terminals for the reason of physical constraint in a case of the fault analysis of the semiconductor circuit device in a wafer state. In such a case, the external terminal to which any voltage is not applied all is set to a floating state electrically. As a result, there is a problem in that the semiconductor circuit device performs an operation different from an actual operation in the case of the fault analysis in the wafer state.

Also, since the above-mentioned example shown in FIG. 2 has the purpose that only a specific circuit which is not used in the normal state is made impossible to operate, a predetermined external terminal is only set to a predetermined potential. Thus, there is a problem in that an optional external terminal can not be set to an optional potential in accordance with the purpose.

SUMMARY OF THE INVENTION

An object of the present invention is to provide a semiconductor device in which a fault state can be reproduced only by the application of a power supply voltage, even if a signal is not supplied from an external terminal.

Another object of the present invention is to provide a semiconductor circuit device in which a fault analysis of a semiconductor element can be carried out in the wafer state.

Still another object of the present invention is to provide a semiconductor circuit device in which a fault cause can be analyzed in an early state, so that a production yield and product quality can be improved.

In order to achieve an aspect of the present invention a semiconductor device includes a power supply voltage line, a ground voltage line, an internal circuit connected to the power supply voltage line and the ground voltage line, a wiring line connected to the internal circuit, and a test circuit connected to the power supply voltage line and the ground voltage line. The test circuit includes a first fuse resistor connected to the power supply voltage line, a first resistor connected between the first fuse resistor and the ground voltage line, a second resistor connected to the power supply voltage line, a second fuse resistor connected between the second resistor and the ground voltage line, a p-type transistor having a first drain connected to the wiring line, a first source connected to the power supply voltage line, and a gate connected to a connection point between the first fuse resistor and the first resistor, and an n-type transistor having a second drain connected to the wiring line, a second source connected to the ground voltage line, and a second gate connected to a connection point between the second resistance and the second fuse resistor.

In this case, it is desirable that the first fuse resistor and the first resistor are provided such that the p-type transistor is not turned on in a normal state, and such that the p-type transistor is turned on to set the wiring line to a power supply voltage on the power supply voltage line when the first fuse resistor is fused. Also, it is desirable that the second resistor and the second fuse resistor are provided such that the n-type transistor is not turned on in a normal state, and such that the n-type transistor is turned on to set the wiring line to a ground voltage on the ground voltage line when the second fuse resistor is fused.

The wiring line may be connected to an external signal terminal.

In order to achieve another aspect of the present invention, a semiconductor device includes a power supply voltage line, a ground voltage line, an internal circuit connected to the power supply voltage line and the ground voltage line, a plurality of wiring lines connected to the internal circuit, and a test circuit provided for each of the plurality of wiring lines, connected to the power supply voltage line and the ground voltage line. The test circuit includes a first fuse resistor connected to the power supply voltage line, a first resistor connected between the first fuse resistor and the ground voltage line, a second resistor connected to the power supply voltage line, a second fuse resistor connected between the second resistor and the ground voltage line, a p-type transistor having a first drain connected to the wiring line, a first source connected to the power supply voltage line, and a gate connected to a connection point between the first fuse resistor and the first resistor, and an n-type transistor having a second drain connected to the wiring line, a second source connected to the ground voltage line, and a second gate connected to a connection point between the second resistance and the second fuse resistor.

In this case, the internal circuit may includes a plurality of memory element blocks, and a decoding circuit connected to the plurality of memory element blocks and the plurality of wiring lines.

In order to achieve still another aspect of the present invention, a semiconductor device includes a power supply voltage line, a ground voltage line, an internal circuit connected to the power supply voltage line and the ground voltage line, a wiring line connected to the internal circuit, and a test circuit connected to the power supply voltage line and the ground voltage line. The test circuit includes a first circuit section including a first fuse resistor, and operating to set the wiring line to a power supply voltage on the power supply voltage line when the first fuse resistor is fused, and a second circuit section including a second fuse resistor, and operating to set the wiring line to a ground voltage on the ground voltage line when the second fuse resistor is fused.

In this case, the first circuit section may includes the first fuse resistor connected to the power supply voltage line, a first resistor connected between the first fuse resistor and the ground voltage line, and a p-type transistor having a first drain connected to the wiring line, a first source connected to the power supply voltage line, and a gate connected to a connection point between the first fuse resistor and the first resistor. Also, the second circuit section may includes a second resistor connected to the power supply voltage line, the second fuse resistor connected between the second resistor and the ground voltage line, a nd an n-type transistor having a second drain connected to the wiring line, a second source connected to the ground voltage line, and a second gate connected to a connection point between the second resistance and the second fuse resistor.

DESCRIPTION OF THE PREFERRED EMBODIMENTS

Next, a semiconductor circuit device of the present invention in which a fault analysis can be carried out in the wafer state will be described in detail with reference to the drawings.

Figure 1:
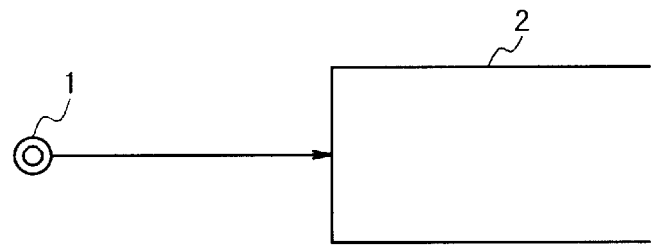
FIG. 1 is a circuit diagram illustrating an input circuit in a conventional example of a semiconductor circuit device.
Figure 2:
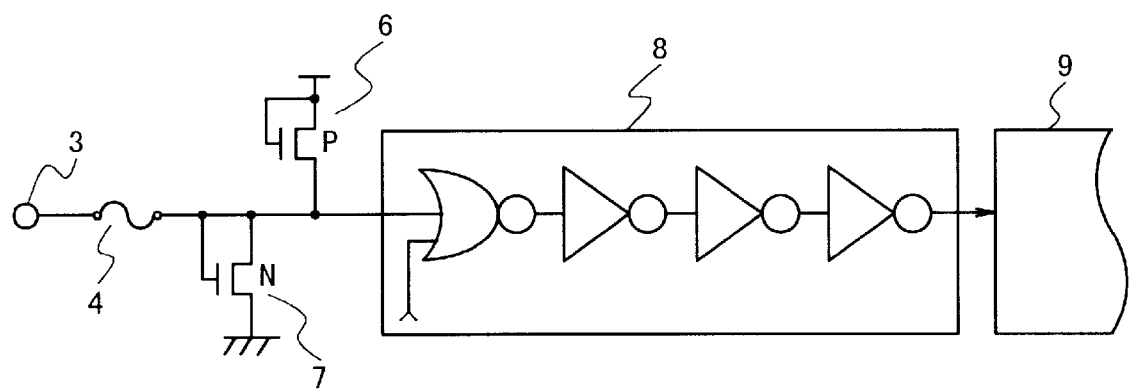
FIG. 2 is a circuit diagram illustrating another input circuit containing a test circuit in another conventional example of a semiconductor circuit device.
Figure 3:
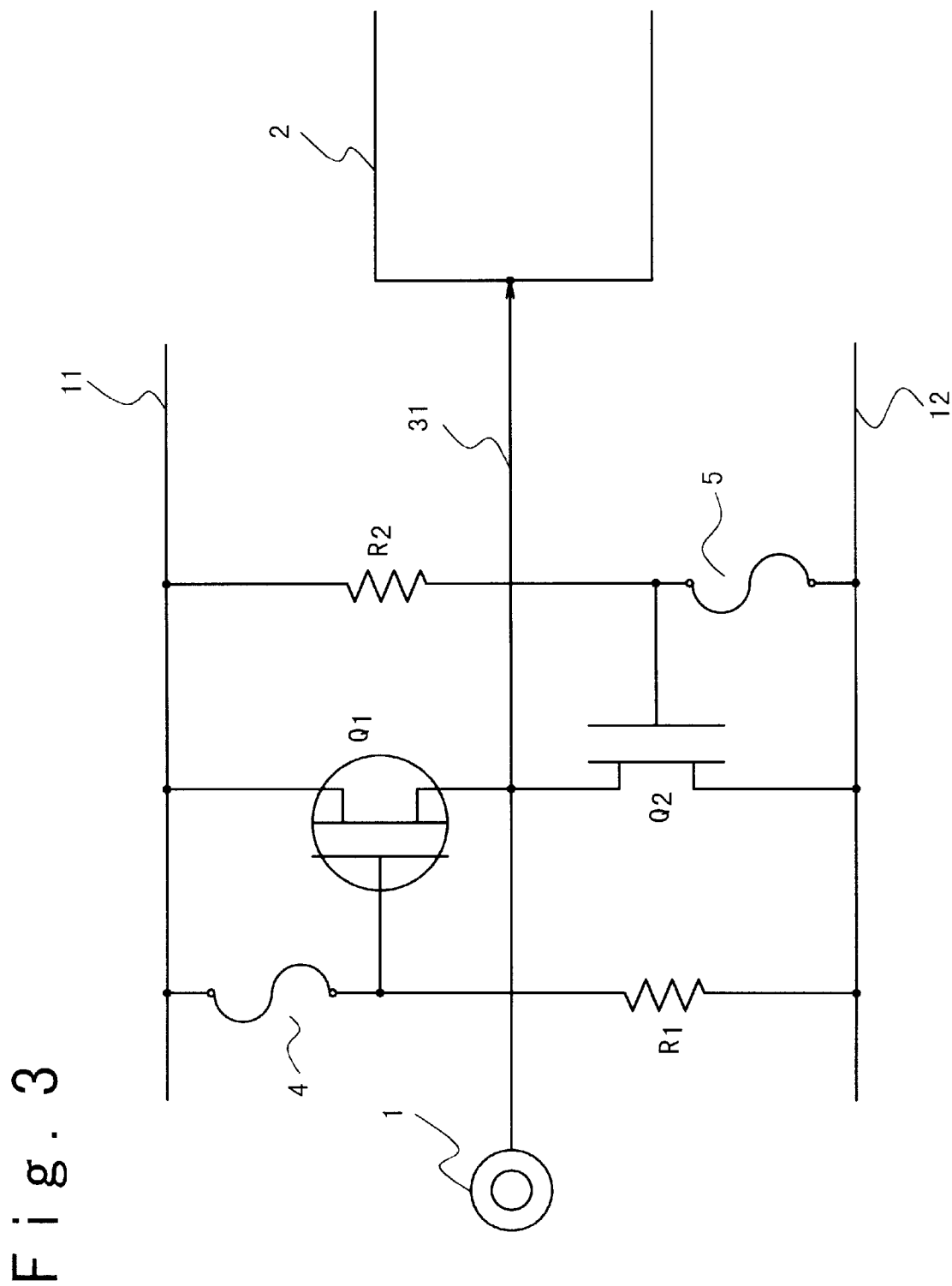
FIG. 3 is a circuit diagram illustrating the structure of a semiconductor circuit device with a test circuit according to an embodiment of the present invention.

FIG. 3 is a circuit diagram illustrating the structure of a the semiconductor circuit device according to an embodiment of the present invention. Referring to FIG. 3, an external terminal 1 shows an optional one of external terminals and all of the external terminals have the same structure. A wiring line 31 is connects the external terminal 1 and an internal circuit 2. The wiring line 31 is connected with a power supply voltage wiring line 11 through a P-type transistor Q1, and is also connected with a ground voltage wiring line 12 through an N-type transistor Q2.

The gate of the transistor Q1 is connected with the power supply voltage wiring line 11 through a fuse resistor 4 and is also connected with a ground voltage wiring line 12 through a high resistance element R1. Also, the gate of the N-type transistor Q2 is connected with the ground voltage wiring line 12 through a fuse resistor 5 and is also connected with the power supply voltage wiring line 11 through a high resistance element R2. The gate levels of the transistors Q1 and Q2 are decided based on the resistance division ratios by the fuse resistors 4 and 5 and the high resistance elements R1 and R2, respectively. Each of the resistance values is previously adjusted so as not to reach the threshold voltage of the transistor so that both of the transistors are set to an off state in a normal state.

When it is found out by an exclusive use tester that a fault occurs if the external terminal 1 is set to "H" level, the fuse resistor 4 is cut such that the gate level of the transistor Q1 is set to a ground potential. Thereby, the transistor Q1 is turned on, so that the potential of the wiring line 31 can be set to "H" level, even if no voltage is given to the external terminal 1.

Also, when it is found out by the exclusive use tester that a fault occurs if the external terminal 1 is set to a "L" level, the fuse resistor 5 is cut such that the gate level of the transistor Q2 is set to a power supply voltage on the line 11. Thereby, the transistor Q2 is turned on so that the potential of the wiring line 31 can be set to "L" level, even if no voltage is given to the external terminal 1.

Figure 4:
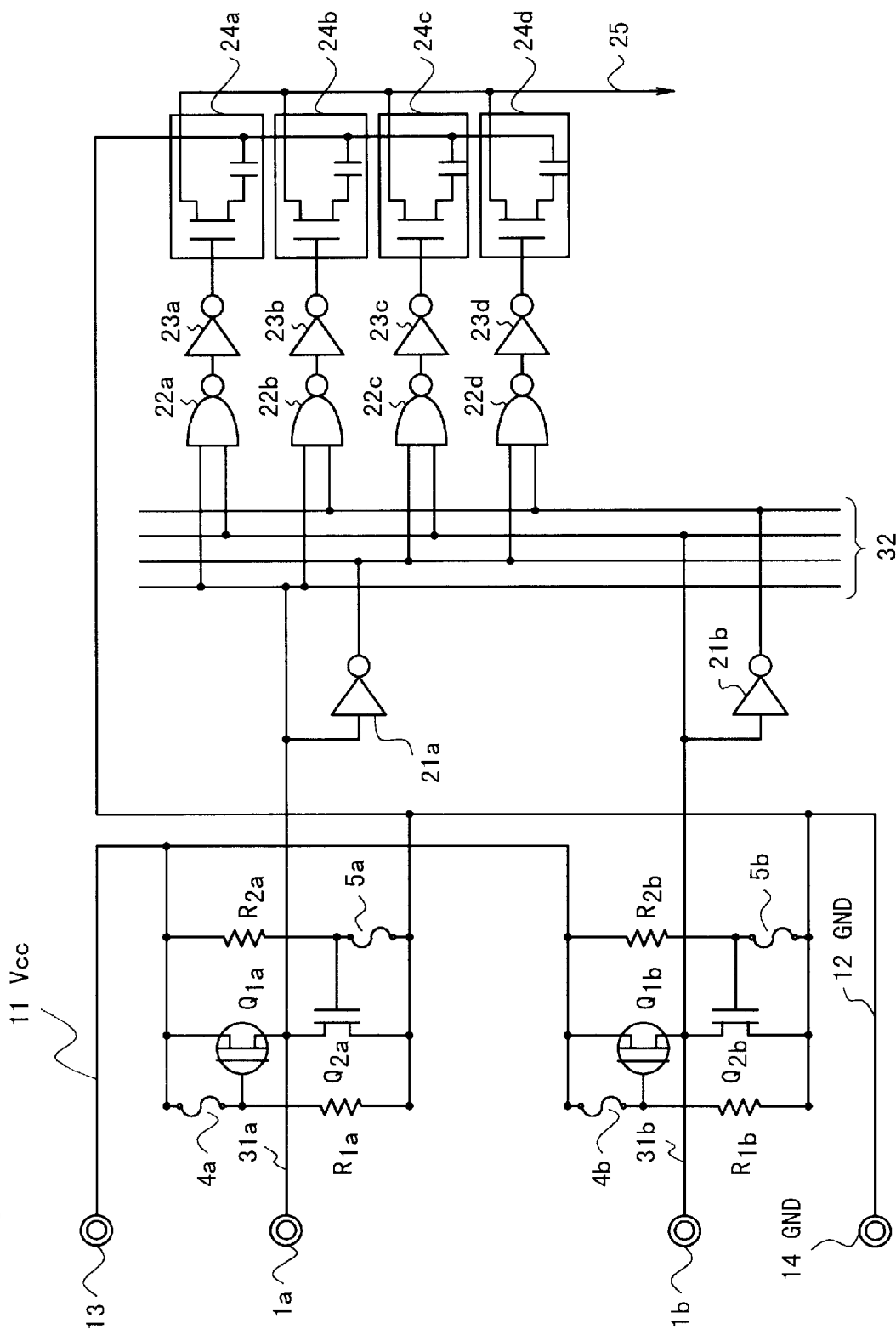
FIG. 4 is a circuit diagram illustrating the structure of another semiconductor circuit device to which the embodiment of the present invention shown in FIG. 3 is applied.

FIG. 4 shows the circuit structure of a semiconductor circuit device such as a dynamic semiconductor memory device according to another embodiment of the present invention, to which the above-mentioned embodiment of the present invention is applied.

Referring to FIG. 4, an external connection terminal 13 and an external connection terminal 14 are external terminals which are connected to a power supply voltage line 11 and the ground voltage line 12, respectively. A same test circuit as shown in FIG. 3 is connected to each of wiring lines 31a and 31b. Address signals are supplied to external terminals 1a and 1b and transferred to address signal lines 32 of an internal circuit via the wiring lines 31a and 31b, respectively. Also, the address signals are inverted by inverters 21a and 21b and then supplied to the address signal lines 32. The signals on the address signal lines 32 are decoded by a decoder. The decoder is composed of NAND circuits 22a to 22d and inverters 23a to 23d. The outputs of the NAND circuits 22a to 22d are connected with storage elements 24 to 24d through the inverters 23a to 23d, respectively. Each of the storage elements 24a to 24d operates in accordance with the address signals.

In the initial stage, all of transistors Q1a, Q1b, Q2a and Q2b of the test circuits are turned off based on the resistance division ratios of fuse resistors 4a, 5a, 4b and 5b and resistance elements R1a, R2a, R1b and R2b. When it is now found out that a fault occurs in the storage elements 24b, the fuse resistors 4a and 5b are cut by an apparatus such as a laser cutter so that the gate level of the transistor Q1a is set to the ground potential. As a result, the transistor Q1a is set to an on state so that the voltage of the wiring line 31a is set to the power supply voltage on the line 11.

Also, the gate level of the transistor Q2b is raised to the power supply voltage by cutting the fuse resistor 5b by the apparatus. As a result, the transistor Q2b is set to an on state so that the voltage of the wiring line 31b is set to the ground voltage on the line 12.

Therefore, the voltage level of the wiring line 31a connected to the external input terminal 1a is set to a "H" level and the voltage level of the wiring line 31b connected to the external input terminal lb is set to a "L" level. In other words, the storage element 24b of the storage elements 24a to 24b is selected by the NAND circuit 22b of the decoder. As a result, the storage element 24b can be selected as the fault storage element which should be tested, even if the external input terminals 1a and 1b are not supplied with any voltage.

In the case where the semiconductor circuit device of this embodiment is used, there is a case that it is found out by the semiconductor device exclusive use tester that the fault occurs, when specific combination voltages are inputted to the external input terminals. In this case, the fuse resistors of the test circuits corresponding to the external input terminals are cut such that the fault is possible to be reproduced. In this manner, the number of external input terminals is sufficient to be small when the present invention is applied to the semiconductor circuit device.

As described above, according to the semiconductor circuit device with the test circuit of the present invention, it is possible to perform a fault analysis of the semiconductor circuit device in the same state as the actual operation state.

At this time, the fault analysis can be performed in the wafer state without physical constraints. Therefore, a fault cause can be analyzed in an early stage, and the improvement of product quality, the improvement of product yield, and the improvement of productivity can be accomplished.

Also, since the small number of optional input voltages are only applied to the external input terminals in the case of the fault analysis in the wafer state, the fault analysis can be precisely carried out to find out the fault cause in the earlier stage.

What is claimed is:

1. A semiconductor device comprising:
    a power supply voltage line;
    a ground voltage line;
    a wiring line connected to an internal circuit; and
    a test circuit connected to said power supply voltage line and said ground voltage line, and
    wherein said test circuit comprises:
    a first fuse resistor connected to said power supply voltage line;
    a first resistor connected between said first fuse resistor and said ground voltage line;
    a second resistor connected to said power supply voltage line;
    a second fuse resistor connected between said second resistor and said ground voltage line;
    a p-type transistor having a first drain connected to said wiring line, a first source connected to said power supply voltage line, and a first gate connected to a connection point between said first fuse resistor and said first resistor; and
    an n-type transistor having a second drain connected to said wiring line, a second source connected to said ground voltage line, and a second gate connected to a connection point between said second resistance and said second fuse resistor.

2. A semiconductor device according to claim 1, wherein said first fuse resistor and said first resistor are provided such that said p-type transistor is not turned on in a normal state, and such that said p-type transistor is turned on to set said wiring line to a power supply voltage on said power supply voltage line when said first fuse resistor is fused.

3. A semiconductor device according to claim 1, wherein said second resistor and said second fuse resistor are provided such that said n-type transistor is not turned on in a normal state, and such that said n-type transistor is turned on to set said wiring line to a ground voltage on said ground voltage line when said second fuse resistor is fused.

4. A semiconductor device according to claim 1, wherein said wiring line is connected to an external signal terminal.

5. A semiconductor device comprising:
    a power supply voltage line;
    a ground voltage line;
    a plurality of wiring lines connected to an internal circuit; and
    a test circuit provided for each of said plurality of wiring lines, connected to said power supply voltage line and said ground voltage line, and
    wherein said test circuit comprises:
    a first fuse resistor connected to said power supply voltage line;
    a first resistor connected between said first fuse resistor and said ground voltage line;
    a second resistor connected to said power supply voltage line;
    a second fuse resistor connected between said second resistor and said ground voltage line;
    a p-type transistor having a first drain connected to said wiring line, a first source connected to said power supply voltage line, and a first gate connected to a connection point between said first fuse resistor and said first resistor; and
    an n-type transistor having a second drain connected to said wiring line, a second source connected to said ground voltage line, and a second gate connected to a connection point between said second resistance and said second fuse resistor.

6. A semiconductor device according to claim 5, wherein said first fuse resistor and said first resistor are provided such that said p-type transistor is not turned on in a normal state, and such that said p-type transistor is turned on to set said wiring line to a power supply voltage on said power supply voltage line when said first fuse resistor is fused.

7. A semiconductor device according to claim 5, wherein said second resistor and said second fuse resistor are provided such that said n-type transistor is not turned on in a normal state, and such that said n-type transistor is turned on to set said wiring line to a ground voltage on said ground voltage line when said second fuse resistor is fused.

8. A semiconductor device according to claim 5, wherein said internal circuit comprises:
    a plurality of memory element blocks; and
    a decoding circuit connected to said plurality of memory element blocks and said plurality of wiring lines.

9. A semiconductor device comprising:
    a power supply voltage line;
    a ground voltage line;
    a wiring line connected to an internal circuit; and
    a test circuit connected to said power supply voltage line and said ground voltage line, and
    wherein said test circuit comprises:
    a first circuit section including a first fuse resistor, said fuse resistor operating to bias a first transistor to set said wiring line to a power supply voltage on said power supply voltage line when said first fuse resistor is fused; and
    a second circuit section including a second fuse resistor, said second fuse and resistor operating to a bias a second transistor to set said wiring line to a ground voltage on said ground voltage line when said second fuse resistor is fused.

10. A semiconductor device according to claim 9, wherein said first circuit section comprises:
    said first fuse resistor connected to said power supply voltage line;
    a first resistor connected between said first fuse resistor and said ground voltage line; and
    a p-type transistor having a first drain connected to said wiring line, a first source connected to said power supply voltage line, and a first gate connected to a connection point between said first fuse resistor and said first resistor.

11. A semiconductor device according to claim 9, wherein said second circuit section comprises:
    a second resistor connected to said power supply voltage line;
    said second fuse resistor connected between said second resistor and said ground voltage line; and
    an n-type transistor having a second drain connected to said wiring line, a second source connected to said ground voltage line, and a second gate connected to a connection point between said second resistance and said second fuse resistor.

12. A semiconductor device according to claim 10, wherein said first fuse resistor and said first resistor are provided such that said p-type transistor is not turned on in a normal state, and such that said p-type transistor is turned on to set said wiring line to a power supply voltage on said power supply voltage line when said first fuse resistor is fused.

13. A semiconductor device according to claim 11, wherein said second resistor and said second fuse resistor are provided such that said n-type transistor is not turned on in a normal state, and such that said n-type transistor is turned on to set said wiring line to a ground voltage on said ground voltage line when said second fuse resistor is fused.

14. A semiconductor device according to claim 9, wherein said wiring line is connected to an external signal terminal.

15. A semiconductor device according to claim 9, wherein said first circuit section comprises:

a first end of said first fuse resistor directly connected to said power supply voltage line;

a first end of a first resistor connected at said wiring line to a second end of said first fuse resistor and, a second end of said first resistor connected directly to said ground voltage line; and said first transistor being a p-type transistor having a first drain connected to said wiring line, a first source connected to said power supply voltage line, and a gate connected to a connection point between said first fuse resistor and said first resistor.

16. A semiconductor device according to claim 9, wherein said second circuit section comprises:

a second resistor connected to said power supply voltage line;

a first end of said second fuse resistor connected at said wiring line directly to said second resistor and, a second end of said second resistor connected to said ground voltage line; and said second transistor being an n-type transistor having a second drain connected to said wiring line, a second source connected to said ground voltage line, and a second gate connected to a connection point between said second resistance and said second fuse resistor.

17. A semiconductor device according to claim 9, wherein said wiring line is further connected to: i) an external signal terminal, ii) a first end of said first fuse resistor, and iii) a first end of said second fuse resistor.

* * * * *